(12) United States Patent
Kawasaki

(10) Patent No.: US 8,252,651 B2
(45) Date of Patent: Aug. 28, 2012

(54) METHOD OF MANUFACTURING SEMICONDUCTOR DEVICE

(75) Inventor: Yoji Kawasaki, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/046,750

(22) Filed: Mar. 13, 2011

(65) Prior Publication Data

US 2011/0269282 A1    Nov. 3, 2011

(30) Foreign Application Priority Data

Mar. 18, 2010 (JP) ................................ 2010-062836

(51) Int. Cl.
*H01L 21/336* (2006.01)
(52) U.S. Cl. ........ 438/285; 438/154; 438/197; 438/293; 257/E21.426; 257/E21.438; 257/E47.001
(58) Field of Classification Search .................. 438/197, 438/285.303, 305, 514, 530, 683, 700, 938; 257/347, E21.426, E21.438, E21.703
See application file for complete search history.

(56) References Cited

U.S. PATENT DOCUMENTS

| 7,317,230 | B2 * | 1/2008 | Lee et al. ....................... 257/401 |
| 2005/0202618 | A1 | 9/2005 | Yagishita |
| 2007/0045736 | A1 | 3/2007 | Yagishita |
| 2009/0072276 | A1 * | 3/2009 | Inaba ............................ 257/255 |
| 2009/0101977 | A1 * | 4/2009 | Iwamatsu et al. ............. 257/347 |

FOREIGN PATENT DOCUMENTS

| JP | 2005-294789 A | 10/2005 |
| JP | 2007-35957 A | 2/2007 |

OTHER PUBLICATIONS

Y. Sasaki et al. "Conformal Doping for FinFETs and Precise Controllable Shallow Doping for Planar FET Manufacturing by a Novel $B_2H_6$/Helium Self-Regulatory Plasma Doping Process", IEDM Tech. Dig., p. 917-920 (2008).

Genshu Fuse, "Ion Implantation Apparatus", Electronic Materials, Dec. 2009, separate vol., p. 67-73.

* cited by examiner

*Primary Examiner* — Charles Garber
*Assistant Examiner* — Abdulfattah Mustapha
(74) *Attorney, Agent, or Firm* — Miles & Stockbridge P.C.

(57) ABSTRACT

A semiconductor device having a FIN type transistor including a FIN-shape semiconductor portion improved for reliability by suppressing scattering of the characteristics of the FIN-shape transistor by decreasing a difference between impurity concentration at an upper surface and impurity concentration on a lateral side of the FIN-shape semiconductor portion, in which a pad insulating film at a thickness of about 2 to 5 nm is formed to the upper surface of the FIN-shape semiconductor portion, cluster ions are implanted to one lateral side of the FIN-shape semiconductor portion from an oblique direction at a first implantation angle θ1 and then cluster ions are implanted to another lateral side of the FIN-shape semiconductor portion from an oblique direction at a second implantation angle θ2 in symmetrical with the first implantation angle θ1 and, subsequently, the cluster ions implanted to the FIN-shape semiconductor portion 10 are activated to form a diffusion region that forms a portion of a source region and a drain region.

12 Claims, 15 Drawing Sheets

DIRECTION y
DIRECTION x

METHOD OF MANUFACTURING SEMICONDUCTOR DEVICE

CROSS-REFERENCE TO RELATED APPLICATIONS

The disclosure of Japanese Patent Application No. 2010-62836 filed on Mar. 18, 2010 including the specification, drawings and abstract is incorporated herein by reference in its entirety.

BACKGROUND OF THE INVENTION

The present invention concerns a technique for manufacturing a semiconductor device and, more specifically, it relates to a technique which is effective when applied to the manufacture of a semiconductor device having a FIN type transistor including a FIN-shape semiconductor portion.

For proceeding with the high integration degree of integrated circuits configuring semiconductor devices, refinement of transistors has been conducted. However, existent planar type transistors have confronted to physical limit, and development of a novel transistor structure other than that of the planar type has been necessary for the refinement of the transistors.

Newly developed transistor structures include, as an example, a FIN-shape transistor of a vertical structure. The FIN type transistor is generally formed over a bulk silicon wafer or an SOI (Silicon On Insulator) wafer. The FIN type transistor formed on the bulk silicon wafer has an advantage that it can be formed at a low cost. Further, the FIN type transistor formed on the SOI wafer is advantageous for high integration degree. Further, it is capable of suppressing the short channel effect. Such FIN type transistors of vertical structure are disclosed, for example, in JP-A-2005-294789 and JP-A-2007-35957.

In any of them, since the impurity concentration profile in the FIN-shape semiconductor portion dominates the transistor characteristic in the same manner as in the planar type transistor, it is important to optimize the profile of the impurity concentration. For example, a doping method of introducing impurities uniformly to the FIN-shape semiconductor portion is described, for example, in Y. Sasaki, K. Okashita, K. Nakamoto, T. Kitaoka, B. Mizuno, and M. Ogura, IEDM Tech. Dig., pp. 917 to 920 (2008) and Genshu Fuse, "Ion Implantation Apparatus", Electronic Materials, December, 2009, separate volume, p. 67 to 73.

SUMMARY OF THE INVENTION

When a source region and a drain region are formed to a FIN-shape semiconductor portion of a FIN-type transistor by using an ion implantation method, it is necessary to implant impurity ions obliquely. However, it is difficult in the ion implantation method to implant impurity ions uniformly to the upper surface and the lateral sides of the FIN-shape semiconductor portion. For example, when impurity ions are implanted to one lateral side to one lateral side of the FIN shape semiconductor in the direction oblique to the one size and then impurity ions are implanted to the other lateral side of the FIN-shape semiconductor portion in the direction oblique to the other lateral surface, the ratio between the amount of the impurity ions implanted to the upper surface and the amount of impurity ions implanted to one lateral side or the other lateral side of the FIN-shape semiconductor portion is 2:1. Therefore, the impurity concentration at the upper surface is higher than the impurity concentration at the lateral side of the FIN-shape semiconductor portion. As a result, the impurity concentration at the upper surface of the FIN-shape semiconductor portion restricts the threshold voltage of the FIN type transistor to result in a problem that a desired threshold voltage cannot be obtained.

The present invention discloses a technique capable of allowing the ratio between the impurity concentration at the upper surface and the impurity concentration at the lateral side of the FIN-shape semiconductor portion to approach from 2:1 to 1:1. By implanting the same amount of impurity ions both for the upper surface and the lateral side of the FIN-shape semiconductor portion, scattering, for example, of the threshold voltage of the FIN type transistor can be decreased. Further, since the setting range for the threshold voltage can be extended, switching is possible by the gate voltage control similar to that of the planar type transistor also in the FIN type transistor.

The present invention intends to provide a technique capable of suppressing the scattering of the characteristics of a FIN-type transistor thereby improving the reliability in a semiconductor device having a FIN-type transistor including a FIN-shape semiconductor portion by decreasing the difference between the impurity concentration at the upper surface and the impurity concentration at the lateral side of the FIN-shape semiconductor portion.

The foregoing and other objects, as well as novel features of the present invention will become apparent with reference to the descriptions in the present specification and appended drawings.

A preferred embodiment for one of typical inventions disclosed in the present application is to be described simply as below.

The embodiment provides a method of manufacturing a semiconductor device having a FIN type transistor including the steps of:

forming a FIN-shape semiconductor portion having an upper surface, one lateral side, and the other lateral side extending along a first direction and forming a pad insulating film over the upper surface of the FIN-shape semiconductor portion;

forming a gate insulating film on the one lateral side and the other lateral side of the FIN-shape semiconductor portion;

forming a gate electrode extending in a second direction perpendicular to the first direction by way of the pad insulating film and the gate insulating film while overriding a portion of the FIN-shape semiconductor portion;

using a cluster solid containing ten or more impurity atoms as an ion material which is evaporated in an oven, ionized, and implanted to the one lateral side of the FIN-shape semiconductor portion having the pad insulating film at the upper surface and not formed with the gate electrode, from a direction at a first implantation angle relative to a normal line;

using a cluster solid containing ten or more impurity atoms as an ion material which is evaporated in an oven, ionized, and implanted to the other lateral side of the FIN-shape semiconductor portion having the pad insulating film at the upper surface and not formed with the gate electrode from a direction at a second implantation angle relative to the normal line; and activating the boron ions implanted to the FIN-shape semiconductor portion to form a diffusion region that forms a portion of a source region and a drain region to the FIN-shape semiconductor portion on both sides of the gate electrode.

Advantageous effects obtained by a typical preferred embodiment of a typical invention among those disclosed in the present application are to be described below.

In a semiconductor device having a FIN type transistor including a FIN-shape semiconductor portion, scattering of characteristics of the FIN type transistor can be suppressed, thereby improving the reliability by decreasing the difference between the impurity concentration at the upper surface and the impurity concentration on the lateral side of the FIN-shape semiconductor portion.

DESCRIPTION OF THE ACCOMPANYING DRAWINGS

Figure 13:
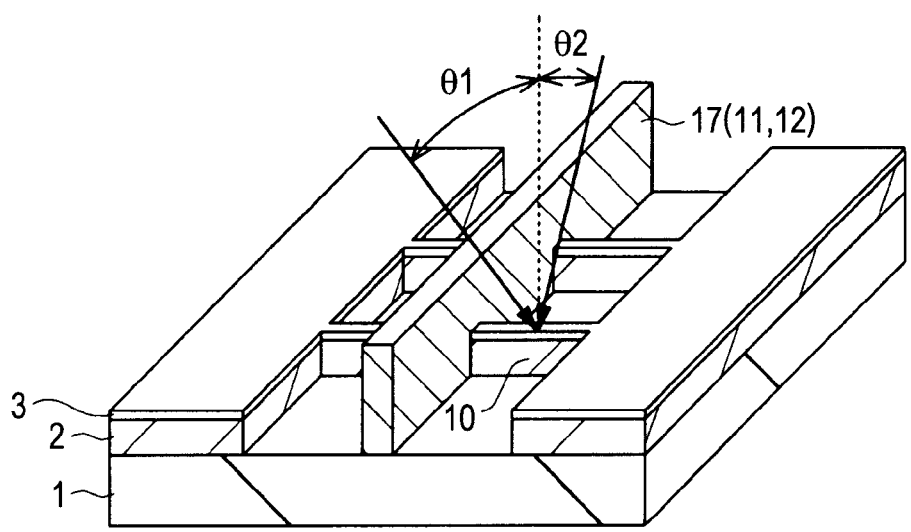
FIG. 13 is a perspective view for a main portion of the FIN type transistor during the manufacturing step succeeding to FIG. 12.
Figure 14A:
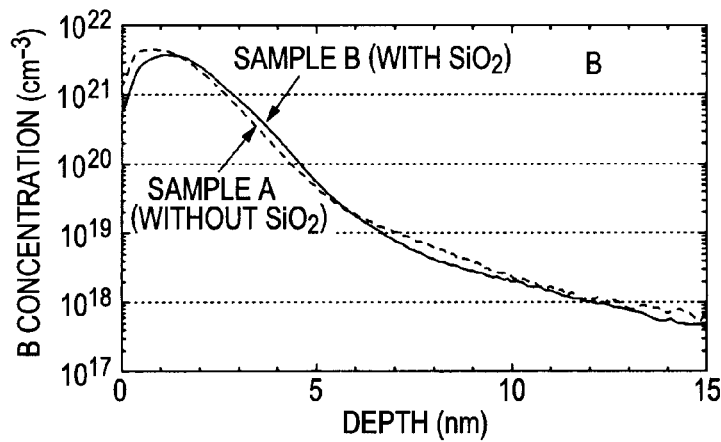
Figure 14B:
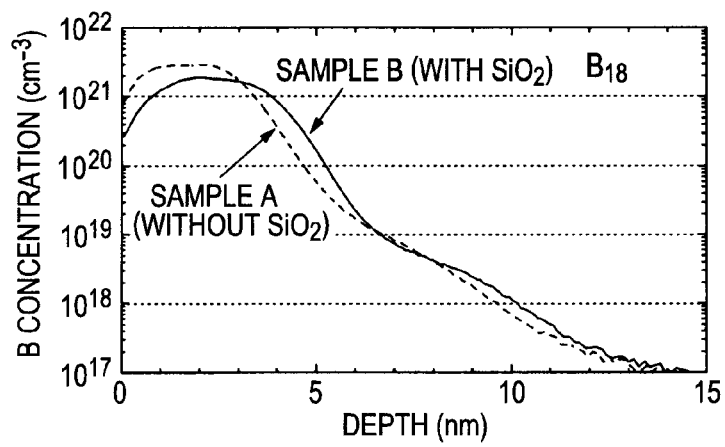
Figure 14C:
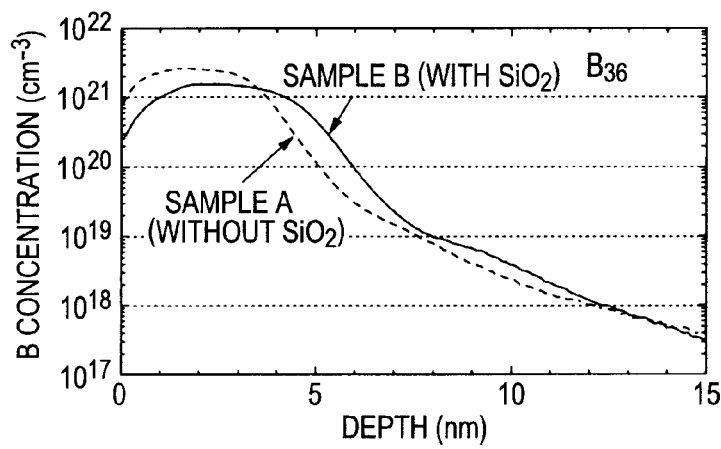
Figure 15:
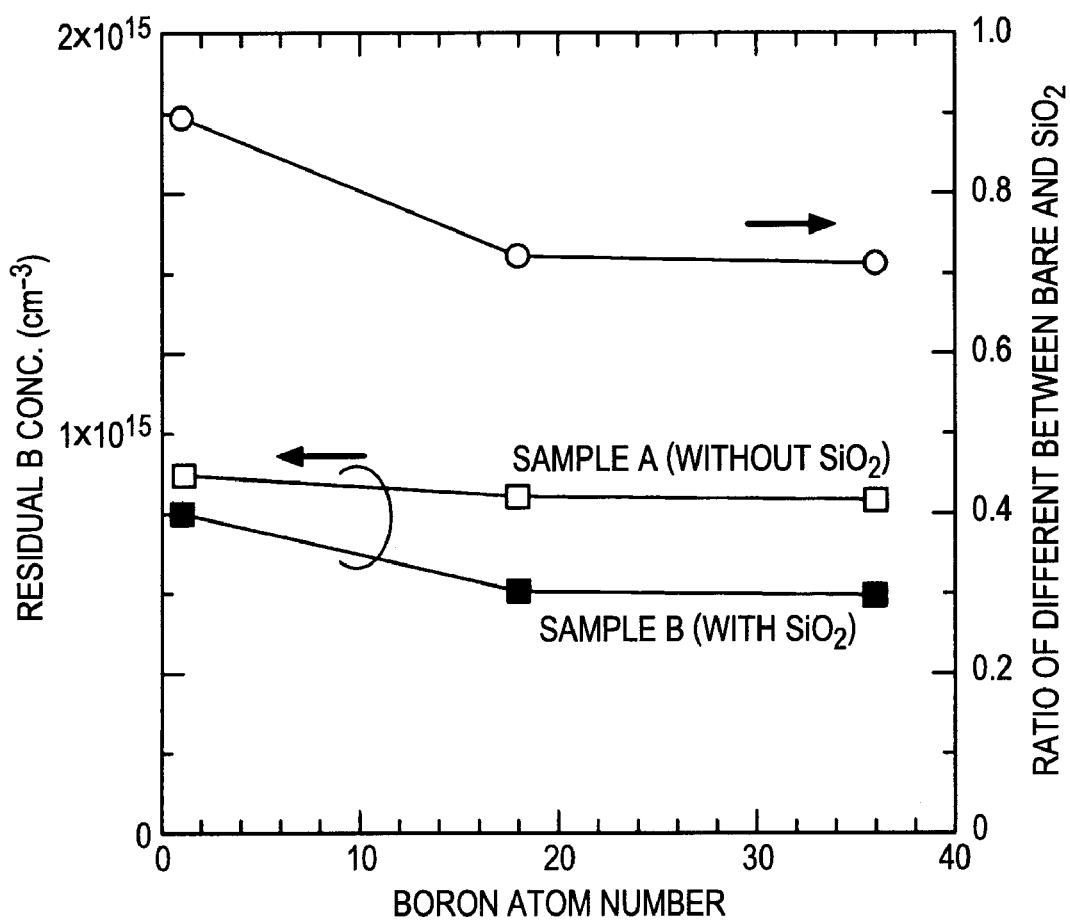
Figure 16A:
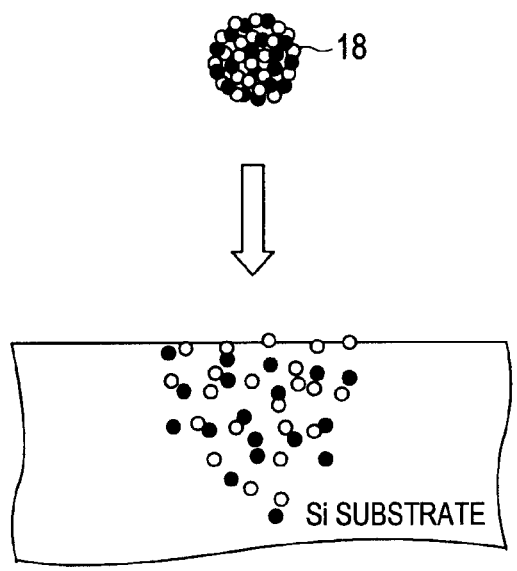
Figure 16B:
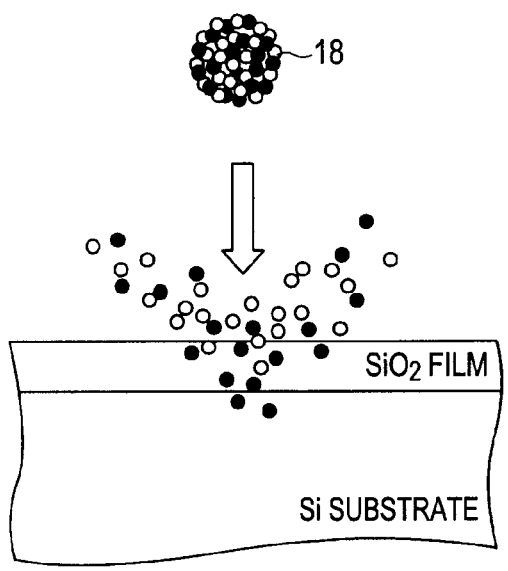
Figure 17A:
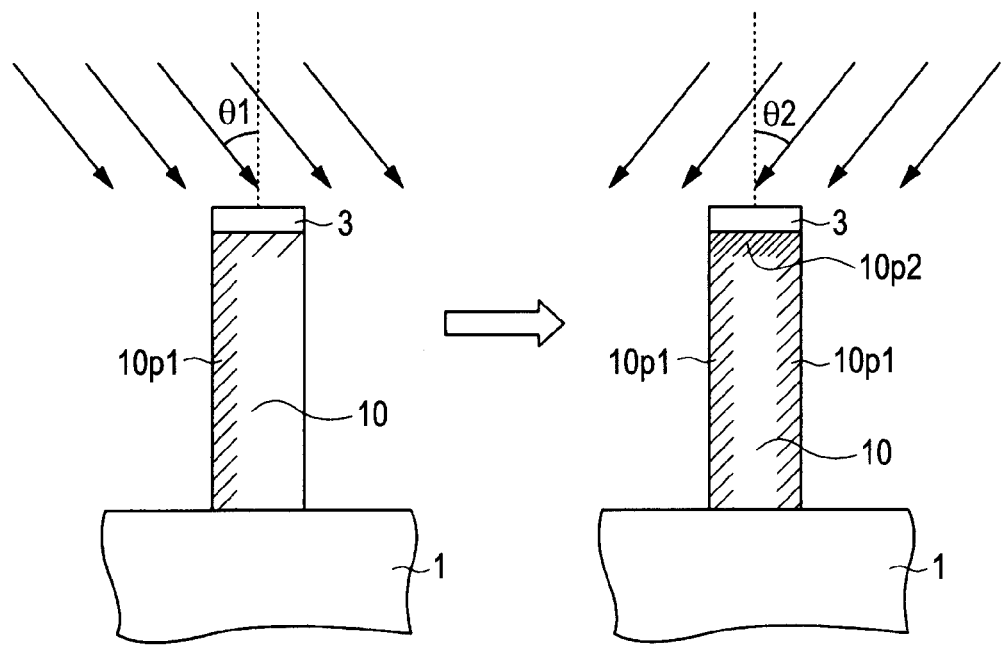
Figure 17B:
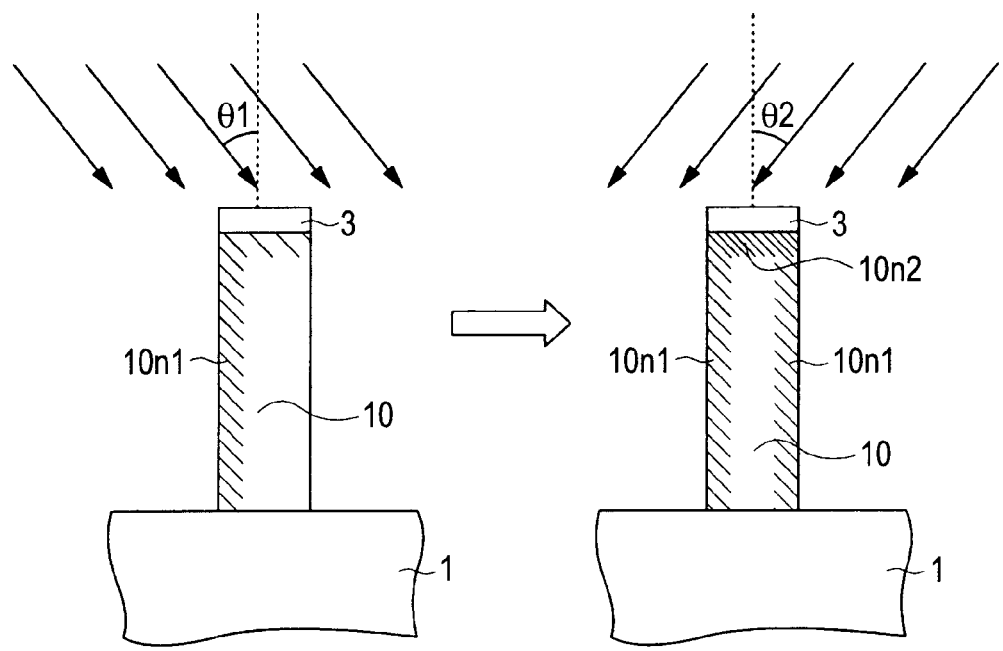
Figure 18A:
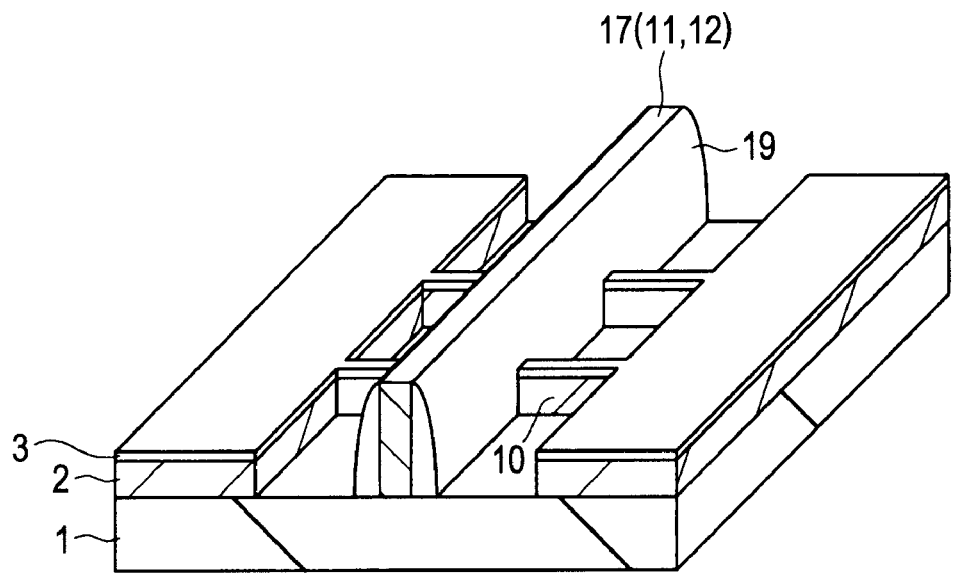
Figure 18B:
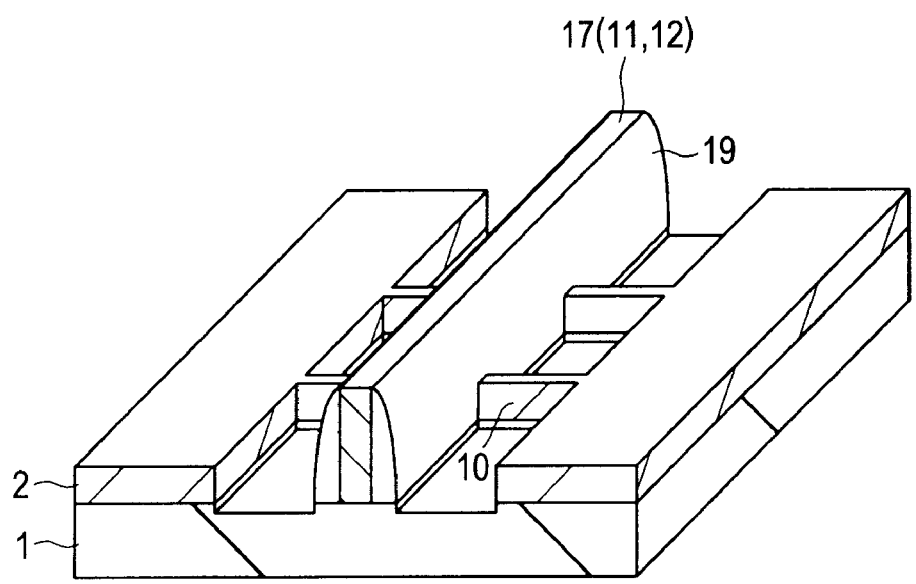
Figure 19:
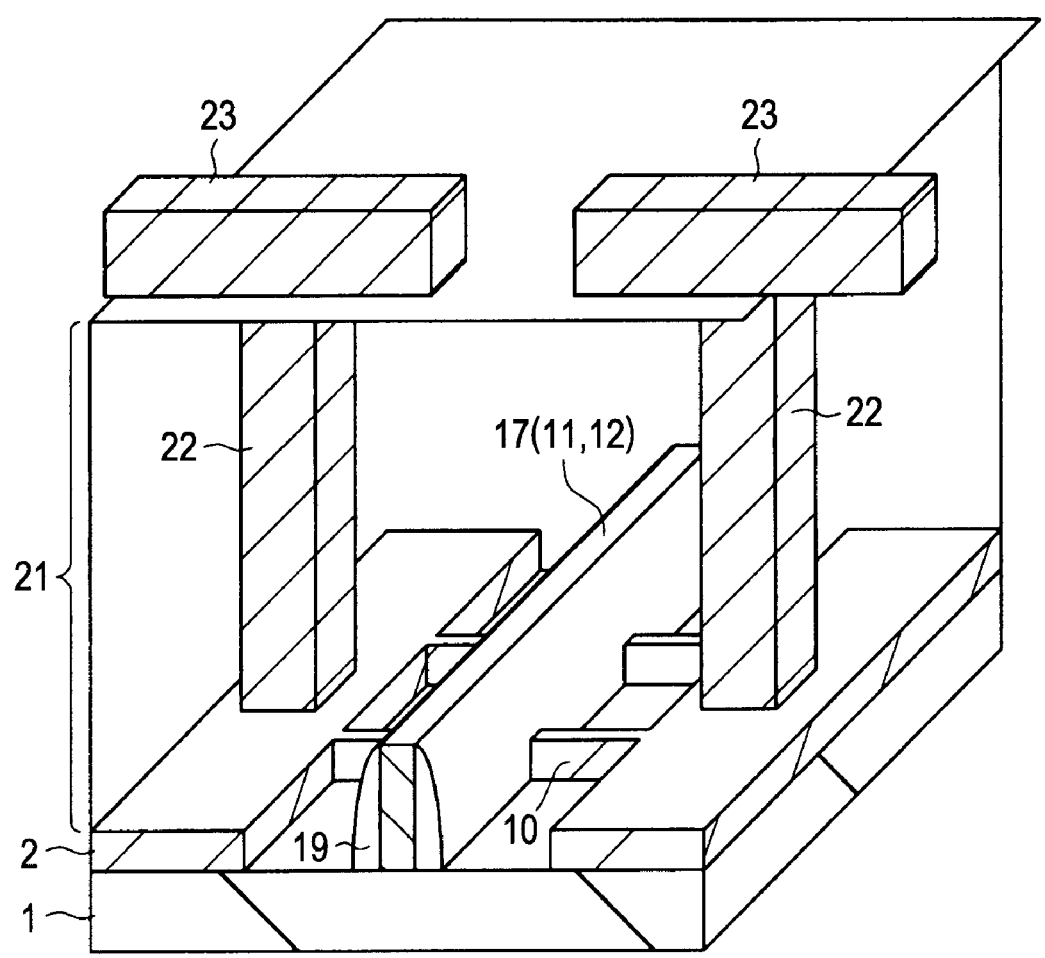

FIGS. 14A to 14C are graphs showing the distribution of a boron concentration in a case of ion implantation to an Si substrate in which FIG. 14A shows a graph for boron ions ($B^+$), FIG. 14B shows a graph for octadecaborane ($B_{18}H_X^+$ ($X \leq 22$)) which is cluster boron ions, and FIG. 14C shows a graph for a dimer of octadecaborane ($([B_{18}H_X (X \leq 22)]-[B_{18}H_{X'} (X' \leq 22)])^+$) which is a cluster boron ion;

FIG. 15 is a graph showing the boron concentrations of a sample A (without $SiO_2$) and a sample B (with $SiO_2$) obtained from the distribution of the boron concentration shown in FIGS. 14A to 14C and a ratio between the boron concentration of the sample A (without $SiO_2$) and the boron concentration of the sample B (with $SiO_2$);

FIGS. 16A and 16B are schematic views for explaining the state of boron atoms upon implantation of cluster boron ions to a substrate in which FIG. 16A is a schematic view for explaining the state of boron atoms upon implantation of cluster boron ions to an Si substrate and FIG. 16B is a schematic view for explaining the state of boron atoms upon implantation of cluster boron ions to an $SiO_2$ film;

FIG. 17 is a schematic view for explaining a method of implantation of cluster boron ions in which FIG. 17A is a schematic view of a method of implantation of cluster boron ions to a pMIS semiconductor portion and FIG. 17B is a schematic view for explaining a method of implantation of cluster boron ions to nMIS semiconductor portion;

FIG. 18 is a perspective view for a main portion of the FIN type transistor during the manufacturing step succeeding to FIG. 13; and FIG. 19 is a perspective view for a main portion of the FIN type transistor during the manufacturing step succeeding to FIG. 18.

PREFERRED EMBODIMENTS OF THE INVENTION

In the embodiments described hereinafter, when it is necessary for the sake of convenience, they may be explained while being divided into a plurality of sections or a plurality of embodiments. However, unless otherwise specified particularly, they are not irrelevant to each other, and there exists a relationship such that one embodiment is a modification, a detailed explanation or a complementary explanation of a portion or the whole of other embodiments.

Further, in the description of the embodiments hereinafter, when the reference is made to a specific number and the like (including number, numerical values, quantity, range and the like) of elements, unless otherwise specified and unless it is obvious that the number and the like of elements are definitely limited to the specific number in principle, the number and the like are not limited to such specific number and may be a number above or below the specific number. Further, in the description of the embodiments hereinafter, it is needless to say that the constituent elements (including element steps and the like) are not always indispensable unless otherwise specified or unless they are considered definitely indispensable in principle. In the same manner, in the description of the embodiments hereinafter, when reference is made to a shape, positional relationship and the like of constituent elements, unless otherwise specified or unless it is considered definitely unreasonable in principle, these shapes and positional relationships substantially include those which approximate or are similar to these shapes. The same goes for the above-mentioned numerical values and ranges.

Further, in the drawings used for the following embodiments, also plan views are sometimes hatched for making the drawings easy to see. Further, in the following embodiments, MISFET (Metal Insulator Semiconductor Field Effect Transistor) that represents field effect transistors is simply referred to as MIS, a p-channel MISFET is simply referred to as pMIS and an n-channel type MISFET is simply referred to as nMIS.

Further, in all of the drawings, constitutional elements which have the same functions are identified by the same symbols and a repeated explanation thereof is omitted. Hereinafter, various embodiments of the present invention will be explained in detail in conjunction with the drawings.

A method of manufacturing a FIN type transistor according to an embodiment of the invention is to be described in the order of steps with reference to FIG. 1 to FIG. 19. FIG. 1 to FIG. 13, FIGS. 18A and 18B, and FIG. 19 are perspective views for main portions of the FIN type transistor, FIGS. 14A, 14B, and 14C are graphs showing the distribution of boron concentration upon ion implantation of boron ions ($B^+$), octadecaborane as cluster boron ions ($B_{18}H_X^+$ ($X \leq 22$)), and a dimer of octadecaborane as cluster boron ions (($[B_{18}H_X(X≦22)]$–$[B_{18}H_{X'}(X'≦22)]$)$^+$) to an Si substrate, FIG. 15 is a graph showing the boron concentrations of the sample A (without $SiO_2$) and sample B (with $SiO_2$) obtained from the distribution of the boron concentrations shown in FIGS. 14A to 14C, and a ratio between the boron concentration of the sample A (without $SiO_2$) and the boron concentration of the sample B (with $SiO_2$), FIGS. 16A and 16B are schematic views for explaining the state of boron atoms upon implantation of the cluster boron ions into an Si substrate and a schematic view for explaining the state of boron atoms upon implantation of cluster boron ions to the $SiO_2$ film respectively, and FIGS. 17A and 17B are schematic views for explaining the method of implantation of cluster boron ions into a semiconductor portion of a pMIS and a schematic view for explaining the method of implantation of cluster ions containing phosphor or arsenic to the semiconductor portion of nMIS, respectively.

The FIN type transistor according to the embodiment is an SOI device formed to an SOI wafer including a BOX (Buried Oxide) layer as an insulating layer and an SOI (Silicon On Insulator) layer as a conductor layer stacked over an Si (Silicon) substrate.

Figure 1:
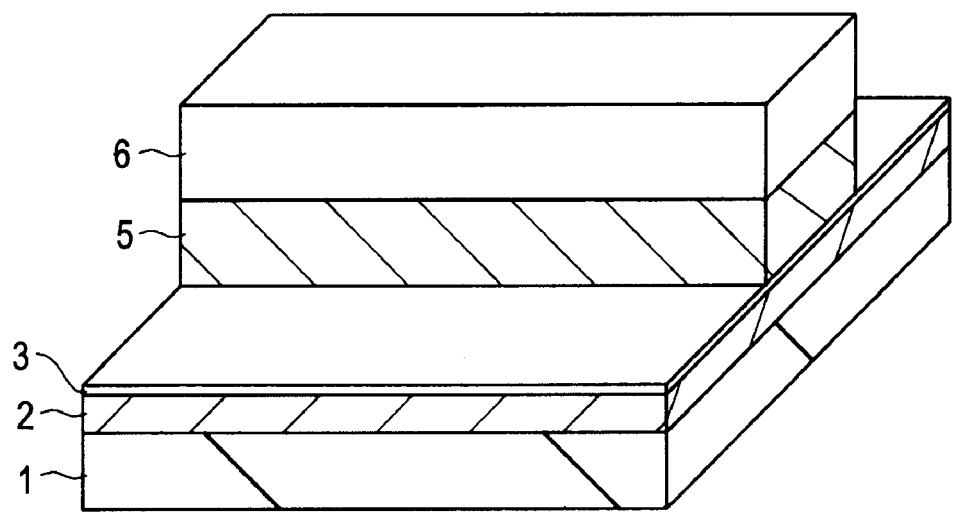
FIG. 1 is a perspective view for a main portion of a semiconductor substrate showing a manufacturing step of a FIN type transistor according to an embodiment of the invention.

At first, as shown in FIG. 1, an SOI layer 2 is stacked over a BOX layer 1 and, a pad insulating film 3 is further stacked over the SOI layer 2. The thickness of the SOI layer 2 is, for example, about 2 to 100 nm and the thickness of the pad insulating film 3 is, for example, about 2 to 5 nm. Successively, polycrystal silicon 5 is deposited over the pad insulating film 3 and then a polycrystal silicon film 5 is patterned by using a patterned resist film 6 as a mask. The thickness of the polycrystal silicon film 5 is, for example, about 100 to 300 nm. The resist film 6 is removed after patterning the polycrystal silicon film 5.

Figure 2:
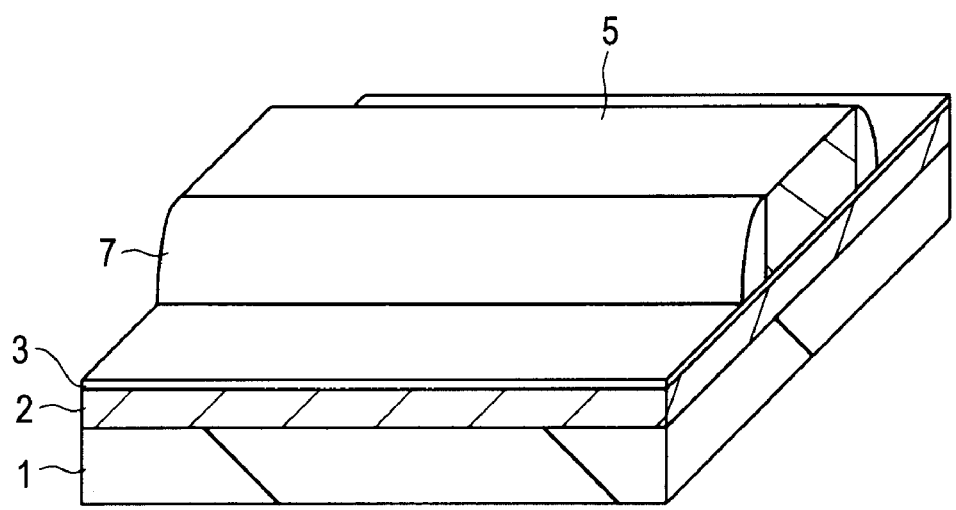
FIG. 2 is a perspective view for a main portion of the FIN type transistor during the manufacturing step succeeding to FIG. 1.

Then, as shown in FIG. 2, a TEOS (Tetra Ethyl Ortho Silicate; $Si(OC_2H_5)_4$) film is deposited over the patterned polycrystal silicon film 5, and the TEOS film is etched by an anisotropic dry etching method to form a side walls 7 including the TEOS film on the side wall of the polycrystal silicon film 5. The thickness of the TEOS film deposited on the polycrystal silicon film 5 is, for example, about 10 to 50 nm.

Figure 3:
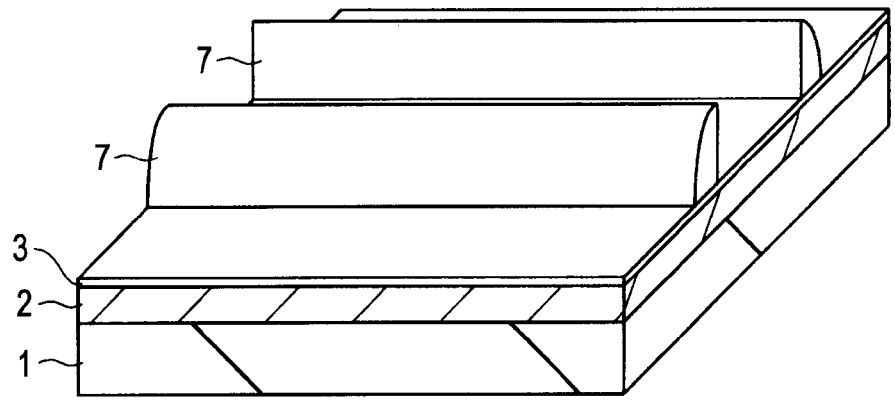
FIG. 3 is a perspective view for a main portion of the FIN type transistor during the manufacturing step succeeding to FIG. 2.
Figure 4:
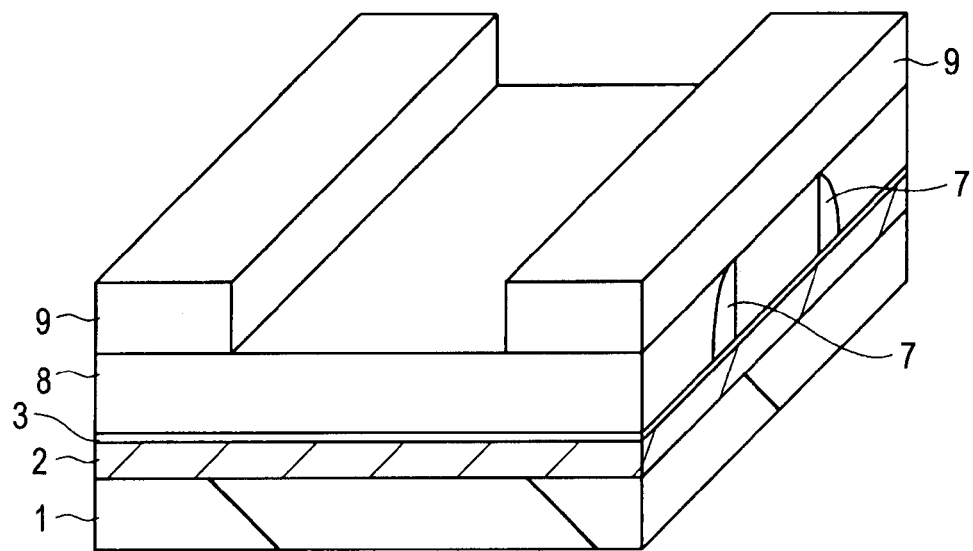
FIG. 4 is a perspective view for a main portion of the FIN type transistor during the manufacturing step succeeding to FIG. 3.

Then, as shown in FIG. 3, the polycrystal silicon film 5 sandwiched between the side walls 7 is removed by a wet etching method. Then, as shown in FIG. 4, a BARC (Bottom Anti Reflection Coating) film 8 as an antireflection film is applied over the pad insulating film 3 including the side walls 7 and, further, a resist film 9 is coated over the BARC film 8. Successively, the resist film 9 is patterned by using a first mask pattern formed so as to conceal a source region and a drain region of the FIN type transistor.

Figure 5:
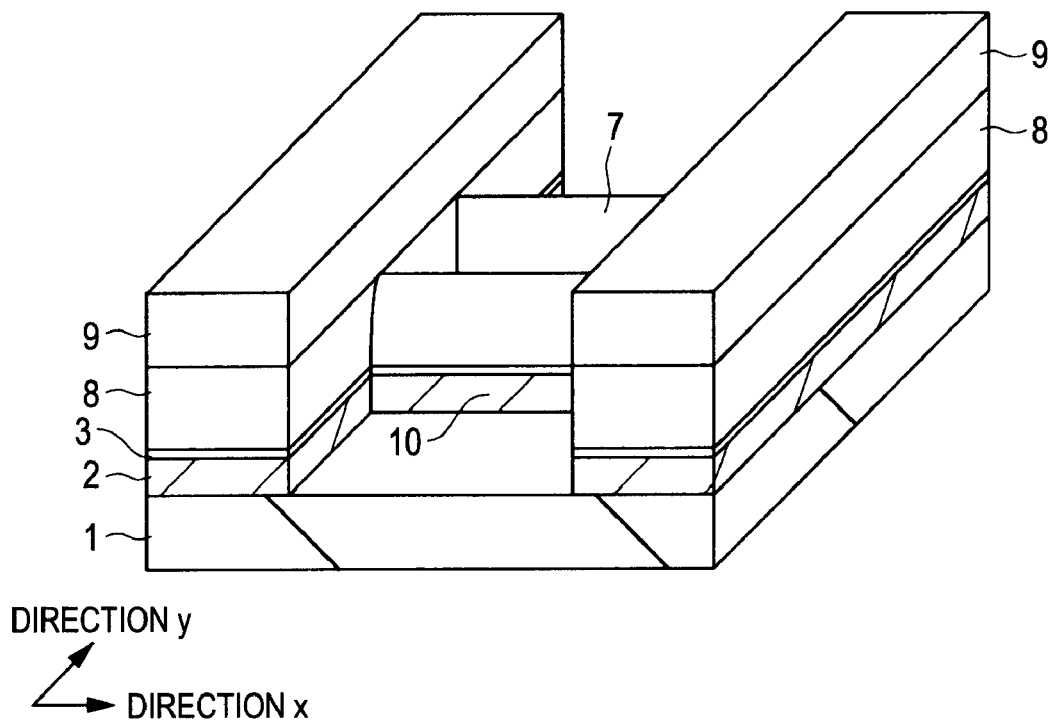
FIG. 5 is a perspective view for a main portion of the FIN type transistor during the manufacturing step succeeding to FIG. 4.

Then, as shown in FIG. 5, the BARC film 8, the pad insulating film 3, and the SOI layer 2 in a region with no resist film 9 are etched successively by using the patterned resist film 9 as a mask. Then, the resist film 9 and the BARC film 8 are removed. In the etching for the pad insulating film 3, since the side wall 7 in addition to the resist film 9 acts as a mask, a FIN-shape semiconductor portion 10 including the SOI layer 2 extending in the first direction (direction x in FIG. 5) is formed.

Figure 6:
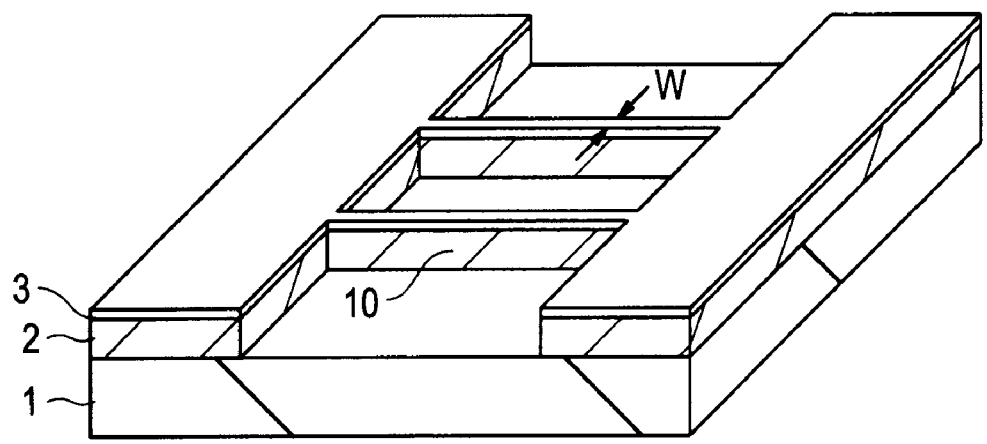
FIG. 6 is a perspective view for a main portion of the FIN type transistor during the manufacturing step succeeding to FIG. 5.

Then, as shown in FIG. 6, after cleaning the surface (lateral side) of the FIN-shape semiconductor portion 10, a gate insulating film (not illustrated) is formed to the surface of the FIN-shape semiconductor portion 10. The FIN-shape semiconductor portion 10 has one lateral side, an upper surface and the other lateral side, and the width W for the upper surface of the semiconductor portion 10 is, for example, about 10 to 50 nm. Further, the total for the height of one lateral side of the semiconductor 10, the width W for the upper surface of the semiconductor portion 10, and the height of the other lateral side of the semiconductor portion 10 forms a channel width of the FIN type transistor.

Figure 7:
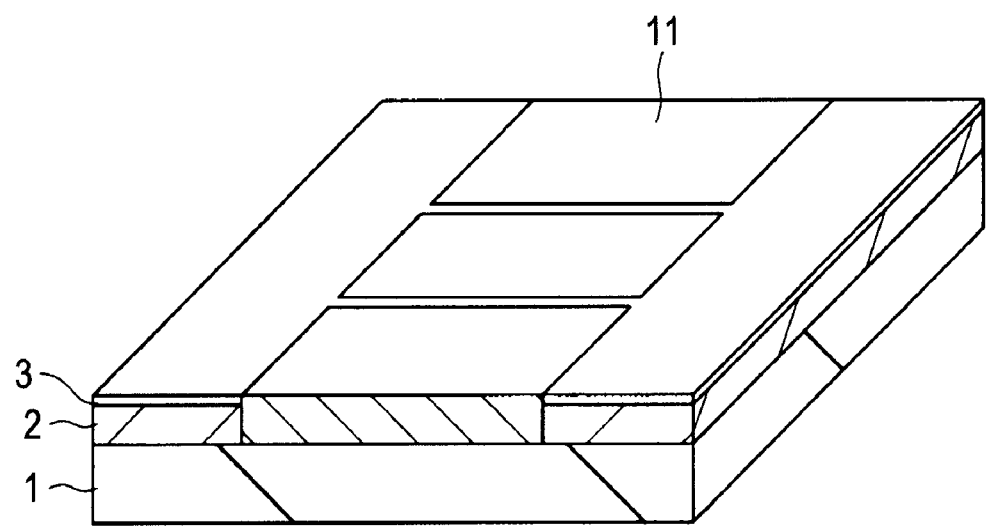
FIG. 7 is a perspective view for a main portion of the FIN type transistor during the manufacturing step succeeding to FIG. 6.

Then, as shown in FIG. 7, a polycrystal silicon film 11 as a gate material is deposited over the entire surface. Successively, the polycrystal silicon film 11 is polished by CMP (Chemical Mechanical Polishing) till the pad insulating film 3 is exposed to planarize the upper surface of the polycrystal silicon film 11.

The characteristic of the FIN type transistor changes greatly depending on the surface treatment for the FIN-shape semiconductor portion 10. Therefore, in the semiconductor device of this embodiment, the surface of the FIN-shape semiconductor 10 where damages remains, for example, by etching is improved for suppressing the degradation of the mobility of the FIN type transistor. Specifically, it is effective to perform, before forming the gate insulating film, a treatment applied to the surface of the FIN-shape semiconductor portion 10 of combining, for example, removal of surface by sacrificial oxidation (about 900 to 1250° C.) or low temperature annealing (at about 400° C.), wet etching or dry etching with less damage, or hydrogen annealing (at about 800° C.).

Figure 8:
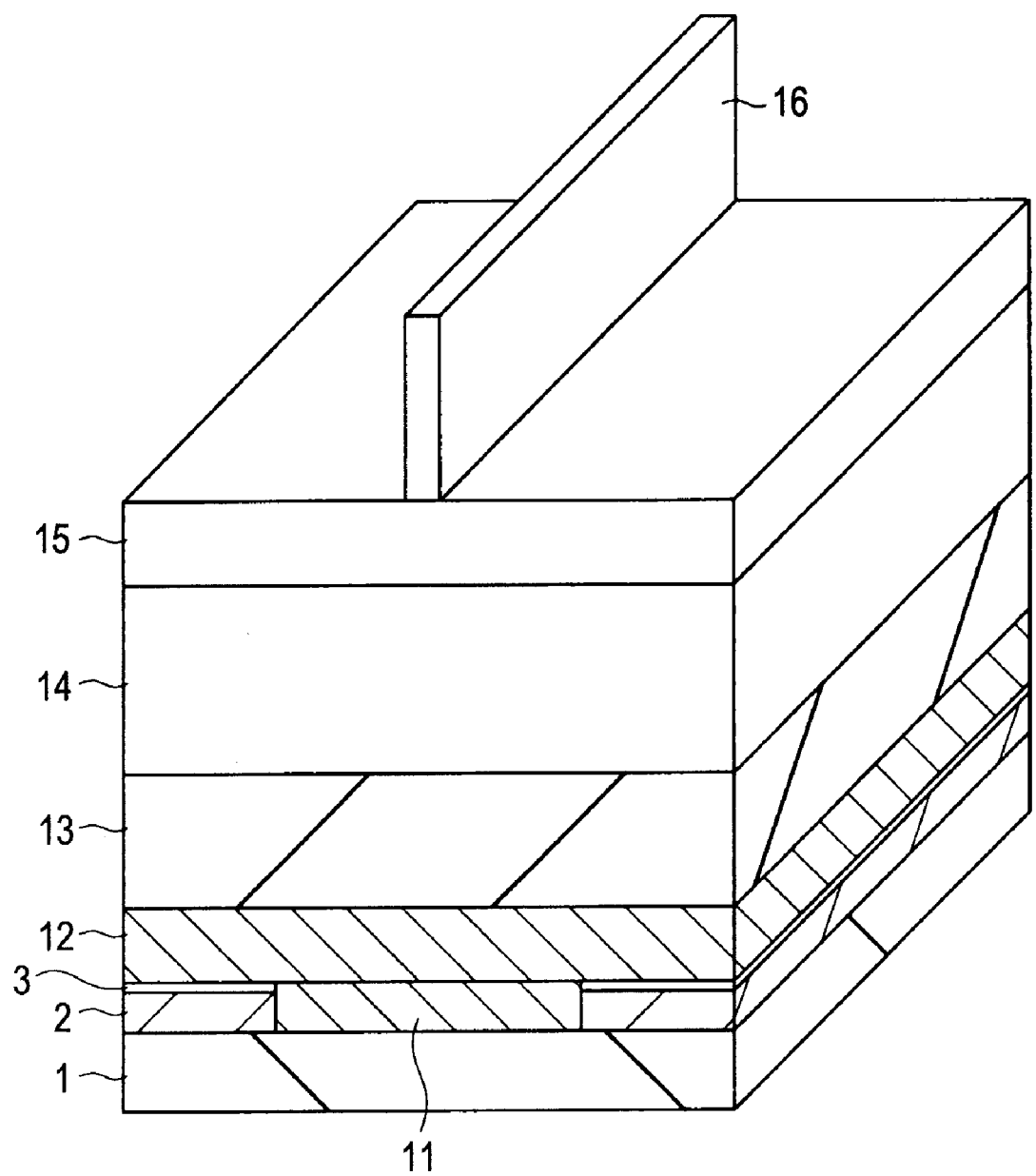
FIG. 8 is a perspective view for a main portion of the FIN type transistor during the manufacturing step succeeding to FIG. 7.

Then, as shown in FIG. 8, a polycrystal silicon film 12 is stacked above the polycrystal silicon film 11 and the pad insulating film 3. Successively, a nitride film 13, a C-HM (carbon-containing hard mask) layer 14, a silicon-containing intermediate layer 15, and a resist film 16 are stacked successively above the polycrystal silicon film 12. The thickness of the nitride film 13 is, for example, about 50 to 200 nm, and the thickness of the C-HM layer 14 is, for example, about 100 to 400 nm. Successively, a resist film 16 for forming a gate electrode is patterned by using a second mask pattern.

Figure 9:
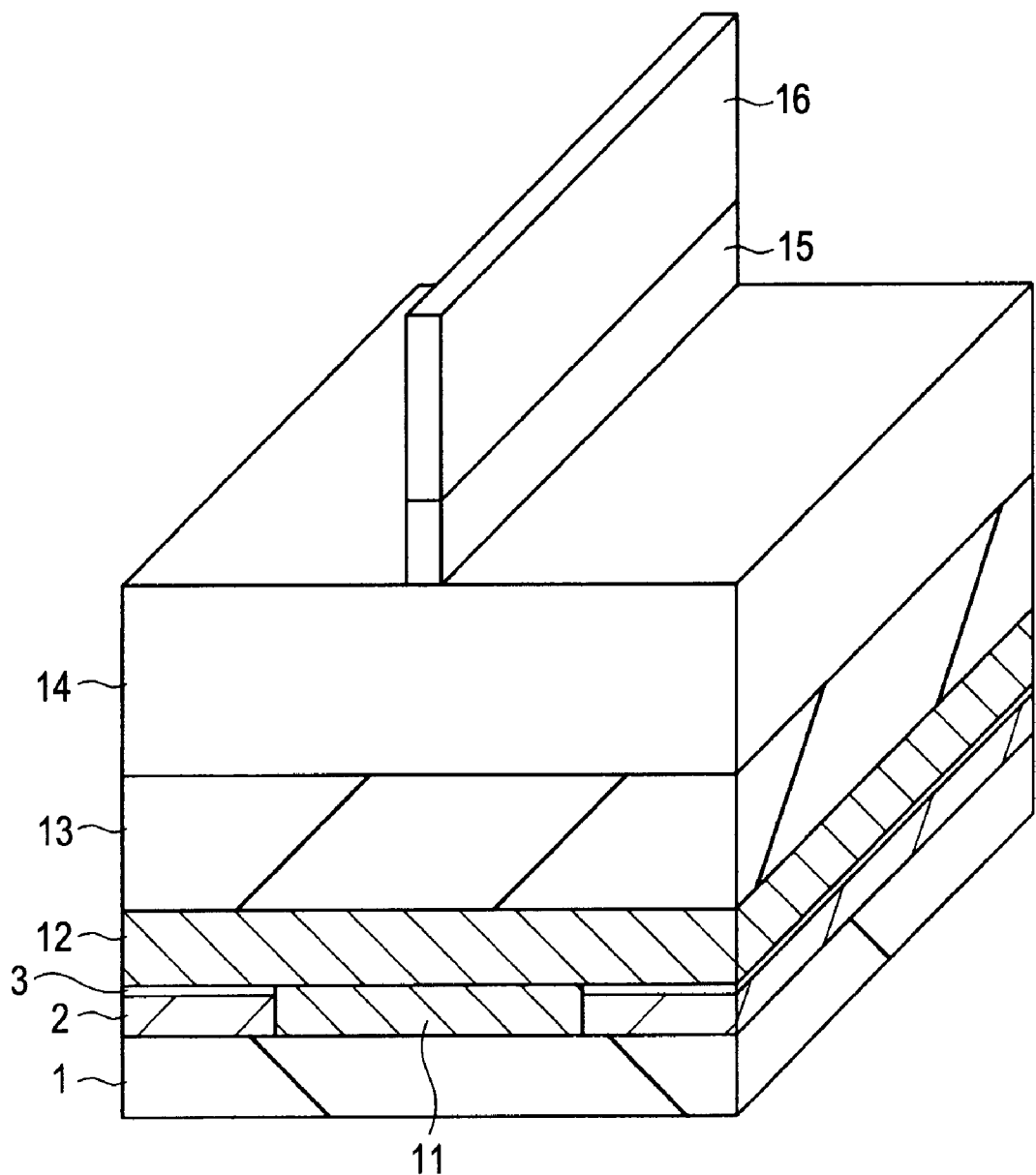
FIG. 9 is a perspective view for a main portion of the FIN type transistor during the manufacturing step succeeding to FIG. 8.
Figure 10:
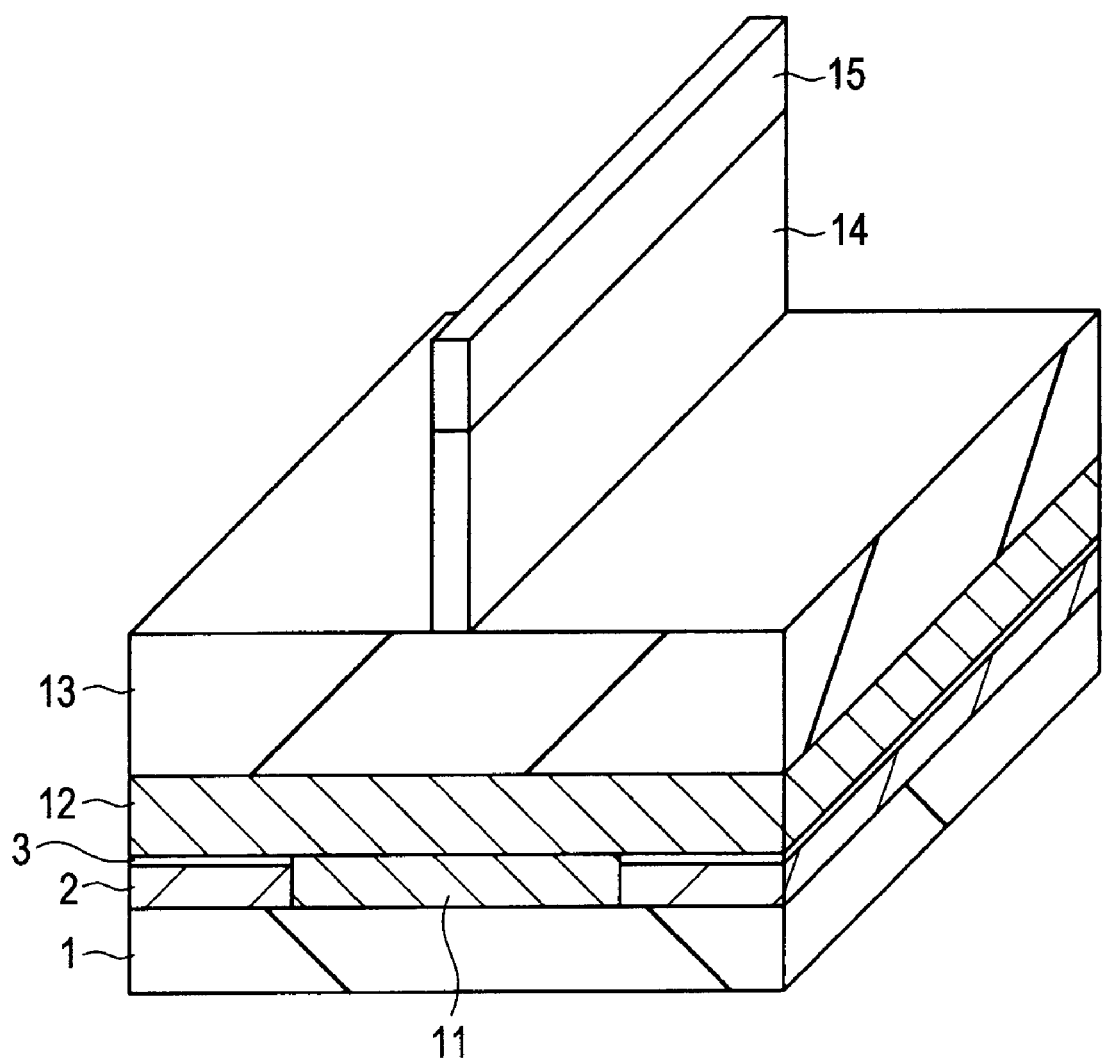
FIG. 10 is a perspective view for a main portion of the FIN type transistor during the manufacturing step succeeding to FIG. 9.
Figure 11:
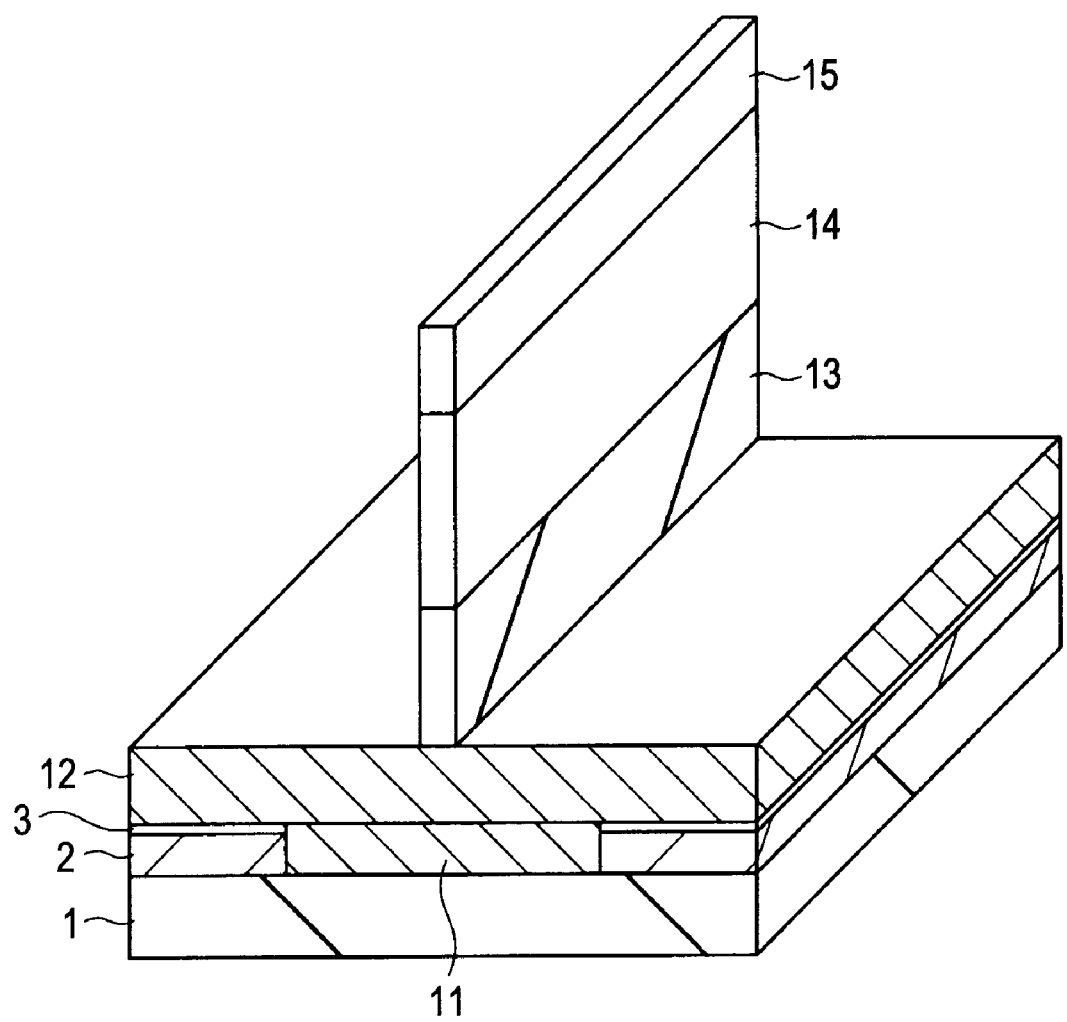
FIG. 11 is a perspective view for a main portion of the FIN type transistor during the manufacturing step succeeding to FIG. 10.

Then, as shown in FIG. 9, the intermediate layer 15 is etched by using the patterned resist film 16 as a mask. Then, as shown in FIG. 10, after removing the resist film 16, the C-HM layer 14 is etched by using the patterned intermediate layer 15 as a mask. Then, as shown in FIG. 11, the nitride film 13 is etched by using the patterned C-HM layer 14 as a mask.

Figure 12:
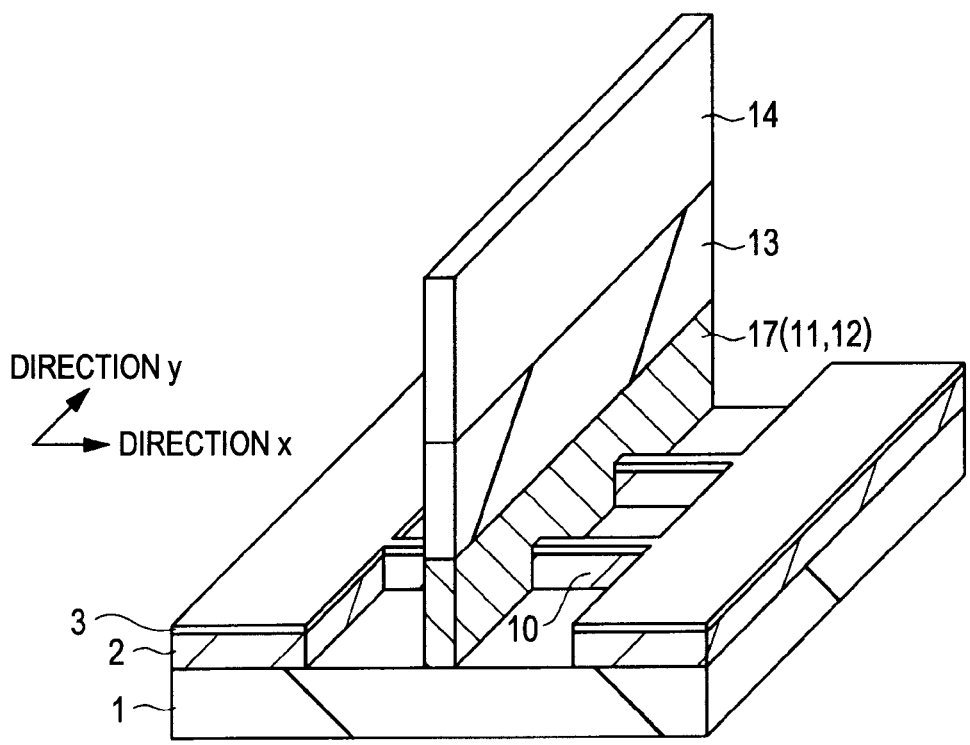
FIG. 12 is a perspective view for a main portion of the FIN type transistor during the manufacturing step succeeding to FIG. 11.

Then, as shown in FIG. 12, after removing the intermediate layer 15, the polycrystal silicon films 11 and 12 are etched by using the patterned nitride film 13 as a mask to form a gate electrode 17 including the polycrystal silicon films 11, 12 extending along a second direction (direction y in FIG. 12).

Then, as shown in FIG. 13, the C-HM layer 14 and the nitride film 13 are removed. Successively, cluster ions (registered trademark) are implanted to one lateral side of the FIN-shape semiconductor 10 from a direction oblique to one lateral side thereof (direction at a first implantation angle θ1 relative to the normal direction vertical to the upper surface of the FIN-shape semiconductor portion 10). Further, cluster ions are implanted to the other lateral side from a direction oblique to the other lateral side thereof (direction at a second implantation angle θ2 in symmetrical with the first implantation angle θ1 relative to the normal direction vertical to the upper surface of the FIN-shape semiconductor portion 10) to form a diffusion region as an extension region. In a case of a pMIS, cluster ions containing a p-type impurity, for example, boron are implanted to the FIN-shape semiconductor portion 10 to form a p-type diffusion region. In a case of an nMIS, cluster ions containing an n-type impurity, for example, phosphorus or arsenic are implanted to the FIN-shape semiconductor portion 10 to form an n-type diffusion region.

In this case, by implanting the cluster ions from the oblique direction at the first implantation angle θ1 to one lateral side of the FIN-shape semiconductor portion 10 and implanting the cluster ions from the oblique direction at the second implantation angle θ2 to the other lateral side thereof in a state where the pad insulating film 3 is present at the upper surface of the semiconductor portion 10, the ratio between the amount of impurity ions implanted to the upper surface of the FIN-shape semiconductor portion 10 and the amount of impurity ions implanted to the lateral side of the FIN-shape semiconductor portion 10 can be decreased to less than 2:1.

FIGS. 14A, 14B, and 14C show the distribution of boron concentration in a case of ion implantation of boron ions (B$^+$), octadacaborane (B$_{18}$H$_X^+$ (X≦22)) as cluster boron ions, and a dimer of octadacaborane (([B$_{18}$H$_X$ (X≦22)]–[B$_{18}$H$_{X'}$ (X'≦22)]$^+$) as cluster boron ions, respectively to an Si substrate. As the sample; a sample A only composed of an Si substrate (without SiO$_2$) and a sample B in which an SiO$_2$ film of 2 nm thickness is formed to the surface of the Si substrate (with SiO$_2$) are used, respectively. Further, FIG. 15 shows the boron concentrations of the sample A (without SiO$_2$) and the sample B (with SiO$_2$) shown in FIGS. 14A to 14C, and the ratio between the boron concentration of the sample A (without SiO$_2$) and the boron concentration of the sample B (with SiO$_2$).

As shown in FIG. 14A to FIG. 15, when the boron ions (B$^+$) are implanted, the concentration of the residual boron atoms in the Si substrate is decreased by about 10% in the sample B (with SiO$_2$) compared with the sample A (without SiO$_2$). Further, when the cluster boron ions (B$_{18}$H$_X^+$ (X≦22) or (([B$_{18}$H$_X$ (X≦22)]–[B$_{18}$H$_{X'}$ (X'≦22)]$^+$) are implanted instead of the boron ions (B$^+$), the concentration of the residual boron atoms implanted to the Si substrate in the sample B (with SiO$_2$) is decreased by about 20% compared with the case of the boron ions. It can be seen from the result described above that the concentration of the residual boron atoms in the Si substrate is decreased by about 30% in a case of using the cluster boron ions in the sample B (with SiO$_2$) compared with the case of the sample A (without SiO$_2$).

The phenomenon that the concentration of the residual boron atoms in the Si substrate is decreased by the implantation of the cluster boron ions to the Si substrate having the SiO$_2$ film formed on the surface thereof can be considered as described below. As shown in FIG. 16A, Si becomes a molten state (liquid layer) simultaneously with implantation of cluster boron ions 18 to the Si substrate and this transforms into an amorphous layer by being cooled from the substrate. In this process, since the atom density of Si lowers momentarily to decrease collision of the boron atoms against Si, the boron atoms intrude at an energy into the amorphous layer in the Si substrate.

On the contrary, since the melting point of SiO$_2$ is higher than that of Si, even when the cluster boron ions 18 are implanted to the SiO$_2$ film, the SiO$_2$ film does not melt and maintain the initial atom densities of Si and O as there are, so that boron atoms decomposed from the cluster form tend to abut against Si and O as shown in FIG. 16B. As a result, a portion of the boron atoms is scattered backward. Therefore, the amount of boron atoms implanted into the Si substrate is decreased further in the case of implantation of the cluster ions by way of the SiO$_2$ film into the Si substrate than in the case of ion implantation of the cluster boron ions directly to the Si substrate.

While depending on the implantation condition of the cluster boron ions 18, when the thickness of the SiO$_2$ film is more than 10 nm, the boron atoms less intrude into the Si substrate, whereas boron atoms at the concentration identical with that of the Si substrate not formed with the SiO$_2$ film include into the Si substrate when the SiO$_2$ film is less than 2 nm. According to the inventors study, it is considered that the thickness of the SiO$_2$ film to be formed on the surface of the Si substrate is preferably within a range from 2 to 5 nm (needless to say, the thickness is not restricted only within the range described above depending on other conditions). Further, it is considered that a range around 2 nm is the most preferred.

The implantation method of the cluster ions is to be described specifically. In a case of a pMIS, as shown in FIG. 17A, a group containing boron atoms by the number of 10 or more (cluster), for example, B$_{18}$H$_{22}$ (octadecaborane) molecule, B$_{10}$H$_{14}$ (decaborane) molecule, or C$_2$B$_{10}$H$_{12}$ (carborane) molecules, etc. are used as the ion material, which are evaporized in an oven and ionized, and the cluster boron ions are implanted to the semiconductor portion 10 under acceleration. Further, the ion implantation is conducted twice while changing the injection direction. At first, cluster boron ions are implanted to one lateral side of the FIN-shape semiconductor portion 10 while setting the first implantation angle θ1 as 5 to 45 degrees and, successively, the cluster boron ions are implanted to the other lateral side of the FIN-shape semiconductor portion 10 at a second implantation angle θ2 of 5 to 45 degrees, thereby forming a p-type semiconductor regions 10p1 to shallow regions on both lateral sides of the FIN-shape semiconductor portion 10.

In this case, ion implantation is conducted twice for the upper surface of the semiconductor portion 10 below the pad insulating film 3 to form a p-type semiconductor region 10p2. However, the cluster boron ions are scattered backward by the pad insulating film 3 by which the amount of ions implanted to the upper surface of the semiconductor portion 10 is decreased to less than the amount of ions implanted to the lateral side of the semiconductor portion 10. At the thickness of the pad insulating film 3 of 2 nm, since the ratio is 0.7:1 between the amount of ions implanted to the upper surface of the semiconductor portion 10 below the pad insulating film 3 and the amount of ions implanted to the lateral side of the semiconductor portion 10 by ion implantation for once, it is considered that the ratio between the amount of ions implanted to the upper surface of the semiconductor portion 10 below the pad insulating film 3 and the amount of ions implanted to the lateral side of the semiconductor portion 10 by twice ion implantation is 1.4 (0.7×2):1. Accordingly, the difference between the impurity concentration in the p-type semiconductor region 10p2 formed to the upper surface of the FIN-shape semiconductor portion 10 and the impurity concentration in the p-type semiconductor regions 10p1 formed on both lateral sides can be approached from 2:1 to 1:1.

In the same manner, in the case of an nMIS, when PH$_3$ (phosphine) or AsH$_3$ (arsine) is used as the starting gas, a tetramer of phosphorous atom (P$_4$) or a tetramer of arsenic atom (As$_4$) are ionized, and cluster phosphor ions or cluster arsenic ions are implanted to the semiconductor portion 10 under acceleration as shown in FIG. 17B. Further, the ion implantation is conducted twice while changing the direction of implantation. That is, the cluster phosphor ions or the cluster arsenic ions are implanted at a first implantation angle θ1 of 5 to 45 degrees to one lateral side of the FIN-shape semiconductor portion 10 and, successively, cluster phosphor ions or cluster arsenic ions are implanted at a second implantation angle θ2 of 5 to 45 degrees to the other lateral side of the FIN-shape semiconductor portion 10 thereby forming n-type semiconductor regions 10n1 in shallow regions on both lateral sides of the FIN-shape semiconductor portion 10.

In this case, ion implantation is conducted twice into the upper surface of the semiconductor portion 10 below the pad insulating film 3 to form n-type semiconductor regions 10n2. However, the cluster phosphorus ions or cluster arsenic ions are scattered backward by the pad insulating film 3 in which the amount of ions implanted to the upper surface of the semiconductor portion 10 is decreased to less than the amount of ions implanted to the lateral side of the semiconductor portion 10. At the thickness of the pad insulating film 3 of 2 nm, since the ratio between the amount of ions implanted to the upper surface of the semiconductor portion 10 below the pad insulating film 3 and the amount of ions implanted to the lateral side of the semiconductor portion 10 by once ion implantation is 0.7:1, it is considered that the ratio between the amount of ions implanted to the upper surface of the semiconductor portion 10 below the pad insulating film 3 and the amount of ions implanted to the lateral side of the semiconductor portion 10 by twice ion implantation is 1.4 (0.7× 2):1. Accordingly, the difference between the impurity concentration in the n-type semiconductor region 10n2 formed to the upper surface of the FIN-shape semiconductor portion 10 and the impurity concentration in the n-type semiconductor region 10n1 formed on both lateral sides can be approached from 2:1 to 1:1.

Then, an annealing treatment is conducted at a temperature of about 700 to 1000° C. to activate the impurity ions ion implanted to the semiconductor portion 10 of the pMIS and the nMIS.

Then, as shown in FIG. 18A, a side wall 19 including a nitride film is formed to the lateral side wall of the gate electrode 17. Then boron-containing cluster ions are ion implanted to the semiconductor portion 10 of the nMIS at an energy greater than the implantation energy of the boron-containing cluster ions upon previous formation of the extension region to form a p-type diffusion region as the source region and the drain region. In the same manner, phosphorus or arsenic-containing cluster ions are ion implanted to the semiconductor portion 10 of the nMIS at an energy greater than the above-described implantation energy of the phosphorus or arsenic-containing ions upon formation of the extension region to form an n-type diffusion region as the source region and the drain region. Then, an annealing treatment is conducted at a temperature of about 1000 to 1100° C. to activate the impurity ions ion implanted to the semiconductor portion 10 of the pMIS and the nMIS.

Then, as shown in FIG. 18B, the pad insulating film 3 is removed by wet etching or the like to expose the upper surface of the FIN-shape semiconductor portion 10 together with both lateral sides of the FIN-shape semiconductor portion 10. The BOX layer may sometimes be depressed upon wet etching of the pad insulating film 3. Then, a silicide film (not illustrated) is formed to the source region and the drain region with an aim of lowering the resistance of the source region and the drain region.

Then, as shown in FIG. 19, a nitride film (not illustrated) and an interlayer oxide film 21 are deposited as a stopper for forming the contact over the entire surface including the source region and the drain region, the gate electrode 17, etc. Successively, after planarizing the surface of the interlayer oxide film 21, for example, by a CMP method, a contact is formed to a predetermined portion of the interlayer oxide film 21, and a metal film, for example, formed of tungsten is buried inside the contact to form a plug 22. Successively, an interconnection 23 electrically coupled with the plug 22 formed inside the contact are formed. By the manufacturing method as described above, a FIN-shape transistor according to this embodiment is completed substantially.

In the embodiment described above, while description has been made to the FIN-shape transistor formed over the SOI layer 2, but the present invention is not restricted only thereto, and the transistor may be a FIN type transistor formed over a bulk silicon wafer.

Further, in the embodiment described above, $SiO_2$ (silicon oxide) is used for the pad insulating film 3 formed over the semiconductor portion 10. Alternatively, a material having a higher melting point than that of Si (silicon), for example, an $Si_3N_4$ (silicon nitride) film, SiON (silicon oxynitride), or SiC (silicon carbide) film may also be used.

Further, although the cluster ions implanted to the semiconductor portion 10 have not been restricted particularly in the embodiment described above, they may be one type or two or more types of cluster ions. Even with one type of the cluster ions, the ratio between the impurity concentration between the upper surface of the semiconductor portion 10 below the pad insulating film 3 and the impurity concentration on the lateral side of the semiconductor portion 10 can be decreased to 2:1 or less. However, when the species of cluster ions are different, since the ratio of backward scattering is also different, the ratio can be decreased further by using two or more types of cluster ions. For example, in a case of the pMIS, the ratio can be controlled by using various species of cluster ions ($B_xH_y^+$ (x=10 to 18)) of different number of boron by controlling a mass analyzer of an ion apparatus. For example, while the ratio is 1.4:1 upon ion implantation, for example, of $B_{18}H_y^+$, since the backward scattering becomes more violent, by ion implantation of $B_{18}H_y^+$ and $B_{12}H_y^+$, the ratio is less than 1.4:1.

As described above according to this embodiment, the impurity concentration in the diffusion region (extension region) which is formed in the semiconductor portion 10 of the FIN-shape semiconductor portion 10 of the FIN-type transistor and configures a portion of the source region and the drain region is at a ratio, for example, of 1.4:1 between the upper surface and the lateral side of the semiconductor portion 10 and the ratio can be decreased to less than 2:1 in the existent case. By decreasing the difference between the impurity concentration at the upper surface and the impurity concentration of the lateral side of the FIN-shape semiconductor portion 10, it is possible to restrict the scattering of the characteristic of the FIN type transistor, thereby improving the reliability. For example, scattering in the threshold voltage of the FIN-type transistor can be decreased. Further, since the setting range for the threshold voltage of the FIN-type transistor can be extended, switching is possible by gate voltage control similar to the planar type transistor.

While the invention made by the present inventors has been described specifically based on preferred embodiments, it will be apparent that the invention is not restricted to the embodiments described above but can be modified variously within a range not departing the gist of the invention.

The present invention is applicable to the manufacture of a semiconductor device having a FIN type transistor including a FIN-shape semiconductor portion.

What is claimed is:
1. A method of manufacturing a semiconductor device having a FIN-type transistor including a FIN-shape semiconductor portion, comprising the steps of:
   (a) forming a FIN-shape semiconductor portion having an upper surface, one lateral side, and another lateral side extending along a first direction and forming a pad insulating film over the upper surface of the FIN-shape semiconductor portion;
   (b) forming a gate insulating film on the one lateral side and the other lateral side of the FIN-shape semiconductor portion;
   (c) forming a gate electrode extending in a second direction perpendicular to the first direction by way of the pad insulating film and the gate insulating film while overriding a portion of the FIN-shape semiconductor portion;

(d) using a cluster containing ten or more impurity atoms as a starting gas which is evaporated in an oven, ionized, and implanted to the one lateral side of the FIN-shape semiconductor portion having the pad insulating film at the upper surface and not formed with the gate electrode, from a direction at a first implantation angle relative to a normal line vertical to the upper surface of the FIN-shape semiconductor portion;

(e) using a cluster containing ten or more impurity atoms as a starting gas which is evaporated in an oven, ionized, and implanted to the other lateral side of the FIN-shape semiconductor having the pad insulating film on the upper surface and not formed with the gate electrode, from a direction at a second implantation angle relative to the normal line vertical to the upper surface of the FIN-shape semiconductor portion; and (f) activating the cluster ions implanted to the FIN-shape semiconductor portion to form a diffusion region that forms a portion of a source region and a drain region to the FIN-shape semiconductor portion on both sides of the gate electrode.

2. The method of manufacturing a semiconductor device according to claim 1, wherein a thickness of the pad insulating film is from 2 to 5 nm.

3. The method of manufacturing a semiconductor device according to claim 1, wherein the pad insulating film includes an insulating film having a melting point higher than that of Si.

4. The method of manufacturing a semiconductor device according to claim 1, wherein the pad insulating film is an $SiO_2$ film, an $Si_3N_4$ film, an SiC film, or an SiON film.

5. The method of manufacturing a semiconductor device according to claim 1, wherein the impurity atom includes $B_{10}$ atoms, $B_{18}$ atoms, or $B_{36}$ atoms.

6. The method of manufacturing a semiconductor device according to claim 1, wherein the impurity atom includes $P_4$ atoms or $As_4$ atoms.

7. The method of manufacturing a semiconductor device according to claim 1, wherein the cluster containing ten or more impurity atoms includes a $B_{18}H_{22}$ molecule, a $B_{10}H_{14}$ molecule, a $([B_{18}H_X]-[B_{18}H_{X'}])^+$ molecule, or a $C_2B_{10}H_{12}$ molecule.

8. The method of manufacturing a semiconductor device according to claim 1, wherein the cluster ions having number of atoms different from each other are implanted in the step (d) and in the step (e) described above.

9. The method of manufacturing a semiconductor device according to claim 8, wherein the cluster ions include $B_xH_y^+$, where x=10 to 18.

10. The method of manufacturing a semiconductor device according to claim 1, wherein the first implantation angle and the second implantation angle are each 5 to 45 degrees.

11. The method of manufacturing a semiconductor device according to claim 1, wherein a ratio between an amount of impurity ions implanted to the upper surface of the FIN-shape semiconductor portion and an amount of impurity ions implanted to the one lateral side or the other lateral side of the FIN-shape semiconductor portion is less than 1.4:1.

12. The method of manufacturing a semiconductor device according to claim 1, further comprising, after the step (f), the steps of:

(g) forming a side wall on the lateral side of the gate electrode;

(h) implanting impurity ions to the FIN-shape semiconductor portion on both sides of the side wall; and (i) activating the impurity ions implanted to the FIN-shape semiconductor portion in the step (h) and forming a diffusion region that forms the other portion of a source region and a drain region to the FIN-shape semiconductor portion on both sides of the side walls.

* * * * *